United States Patent
Geshi et al.

(10) Patent No.: US 7,378,691 B2
(45) Date of Patent: May 27, 2008

(54) SOLID-STATE IMAGE SENSOR

(75) Inventors: Tatsurou Geshi, Hikone (JP); Mamoru Arimoto, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 154 days.

(21) Appl. No.: 11/362,183

(22) Filed: Feb. 27, 2006

(65) Prior Publication Data
US 2006/0197114 A1    Sep. 7, 2006

(30) Foreign Application Priority Data
Feb. 28, 2005    (JP)    ............................ 2005-052200

(51) Int. Cl.
*H01L 27/148*    (2006.01)
(52) U.S. Cl. ................. 257/223; 257/233; 257/E27.139
(58) Field of Classification Search ................. 257/222, 257/223, 233, 291, 292, E27.133, E27.139, 257/229
See application file for complete search history.

(56) References Cited

U.S. PATENT DOCUMENTS 6,331,873 B1*   12/2001   Burke et al. ................. 348/314
7,214,974 B2*    5/2007   Shin ............................ 257/225
7,271,430 B2*    9/2007   Park et al. ................... 257/225
2005/0230720 A1*  10/2005  Miyagawa et al. ......... 257/292
2006/0049431 A1*   3/2006  Kaida .......................... 257/222

FOREIGN PATENT DOCUMENTS

JP    2001-53263 A    2/2001

* cited by examiner

Primary Examiner—Tuan N. Quach
(74) Attorney, Agent, or Firm—McDermott Will & Emery LLP

(57) ABSTRACT

A solid-state image sensor capable of suppressing blooming and increase of a dark current also when an n-type impurity concentration in a transfer channel region is increased is obtained. In this solid-state image sensor, gate electrodes of a prescribed pixel and another pixel adjacent to the prescribed pixel are provided at a first space, and a larger quantity of second conductivity type impurity is introduced into a region of a first conductivity type transfer channel region, located on the main surface of a substrate, corresponding to the first space as compared with a second conductivity type impurity contained in the remaining region of the transfer channel region other than the region corresponding to the first space.

17 Claims, 5 Drawing Sheets

SOLID-STATE IMAGE SENSOR

BACKGROUND OF THE INVENTION

1. Field of the Invention

The present invention relates to a solid-state image sensor, and more particularly, it relates to a solid-state image sensor comprising gate electrodes transferring charge.

2. Description of the Background Art

A solid-state image sensor comprising gate electrodes transferring charge is known in general, as disclosed in Japanese Patent Laying-Open No. 2001-53263, for example.

FIG. 10 is a sectional view for illustrating the structure of an exemplary conventional solid-state image sensor having a structure similar to that of the solid-state image sensor disclosed in the aforementioned Japanese Patent Laying-Open No. 2001-53263. Referring to FIG. 10, a plurality of pixels 101 are adjacently arranged in the exemplary conventional solid-state image sensor. This exemplary conventional solid-state image sensor comprises an n-type substrate 102. A p-type well region 103 is formed on a region of a prescribed depth from the upper surface of the n-type substrate 102. A plurality of n-type high-concentration impurity regions 104 are formed on prescribed regions of the surface of the n-type substrate 102 at prescribed intervals. The n-type high-concentration impurity regions 104 are formed on regions shallower than the p-type well region 103.

P-type impurity regions 105 are formed on the surfaces of the n-type high-concentration impurity regions 104. These p-type impurity regions 105, the aforementioned n-type high-concentration impurity regions 104 and the p-type well region 103 constitute photoelectric conversion portions 106. These photoelectric conversion portions 106 are provided in one-to-one correspondence to the pixels 101 respectively. N-type transfer channel regions 107 are formed on regions of the surface of the n-type substrate 102 located between adjacent pairs of photoelectric conversion portions 106 respectively. These transfer channel regions 107 function as paths for transferring charge generated in the photoelectric conversion portions 106.

A gate insulating film 108 is formed to cover the overall surface of the n-type substrate 102. Gate electrodes 109a and 109b transferring charge are formed on regions of the gate insulating film 108 corresponding to the transfer channel regions 107. Each pair of gate electrodes 109a and 109b are provided in one-to-one correspondence to each pixel 101. The gate electrodes 109a and 109b included in each pixel 101 are arranged at a prescribed space, to hold the corresponding photoelectric conversion portion 106 therebetween. The gate electrode 109a of a prescribed pixel 101 and the gate electrode 109b of another pixel 101 adjacent to the prescribed pixel 101 are arranged through an insulating film 110. The gate electrode 109b of the prescribed pixel 101 partially overlaps on the gate electrode 109a of the adjacent pixel 101.

In imaging, a low-level voltage is applied to the gate electrodes 109a and 109b, so that the potentials of the transfer channel regions 107 located under the gate electrodes 109a and 109b are higher than those of the photoelectric conversion portions 106. Thus, potential wells are formed in the photoelectric conversion portions 106 for storing charge generated by photoelectric conversion in imaging. At this time, potential barriers are formed on the transfer channel regions 107 for separating the potential wells formed in pairs of photoelectric conversion portions 106 adjacent to each other through the transfer channel regions 107.

In the exemplary conventional solid-state image sensor shown in FIG. 10, however, the potentials of the transfer channel regions 107 are disadvantageously reduced when n-type impurity concentrations in the transfer channel regions 107 are increased in order to increase the quantity of charge transfer. Thus, the height of the potential barriers formed on the transfer channel regions 107 in imaging is so reduced that the charge may flow out from the potential well of a prescribed photoelectric conversion portion 106 into the potential well of another photoelectric conversion portion 106 adjacent to the prescribed photoelectric conversion portion 106 through the corresponding transfer channel region 107. This outflow of the charge disadvantageously results in blooming, a phenomenon brightly displaying unirradiated portions. When the n-type impurity concentrations in the transfer channel regions 107 are increased, further, hole concentrations are disadvantageously reduced in the transfer channel regions 107. If unintentional charge is resulting from thermal excitation or the like in the transfer channel regions 107 located under OFF-state gate electrodes 109a and 109b in this case, the quantity of unintentional charge not captured by holes is disadvantageously increased. Thus, a dark current resulting from such unintentional charge is disadvantageously increased.

SUMMARY OF THE INVENTION

The present invention has been proposed in order to solve the aforementioned problems, and an object of the present invention is to provide a solid-state image sensor capable of suppressing blooming and increase of a dark current also when an n-type impurity concentration in a transfer channel region is increased.

In order to attain the aforementioned object, a solid-state image sensor according to an aspect of the present invention comprises a plurality of pixels each including a photoelectric conversion portion provided on a prescribed region of the main surface of a substrate, a gate electrode provided on the main surface of the substrate for transferring charge generated in the photoelectric conversion portion and a first conductivity type transfer channel region formed on a portion of the main surface of the substrate located between the photoelectric conversion portion and an adjacent photoelectric conversion portion for transferring the charge. The gate electrode of a prescribed pixel and the gate electrode of another pixel adjacent to the prescribed pixel are provided at a first space, and a larger quantity of second conductivity type impurity is introduced into a region of the first conductivity type transfer channel region, located on the main surface of the substrate, corresponding to the first space as compared with a second conductivity type impurity contained in the remaining region of the transfer channel region other than the region corresponding to the first space.

In the solid-state image sensor according to this aspect, as hereinabove described, the gate electrodes of the prescribed pixel and another pixel adjacent to the prescribed pixel are provided at the first space while a larger quantity of second conductivity type impurity is introduced into the region of the first conductivity type transfer channel region, located on the main surface of the substrate, corresponding to the first space as compared with the second conductivity type impurity contained in the remaining region of the transfer channel region other than the region corresponding to the first space, whereby a potential barrier higher than that of the remaining region of the transfer channel region other than the region corresponding to the first space can be formed on the region of the transfer channel region corresponding to the first space when the first and second conductivity types are n- and p-types respectively, for example. Also when the n-type impurity concentration in the transfer channel region is increased to reduce the heights of the potential barriers of the transfer channel region, therefore, the potential barrier on the region of the transfer channel region corresponding to the first space can suppress outflow of the charge from a potential well of the photoelectric conversion portion of the prescribed pixel into a potential well of the photoelectric conversion portion of another pixel adjacent to the prescribed pixel through the transfer channel region. Thus, blooming, a phenomenon brightly displaying an unirradiated portion, resulting from such outflow of charge can be suppressed. Further, a hole concentration can be increased in the region of the transfer channel region corresponding to the first space by introducing a larger quantity of p-type impurity into the region of the n-type transfer channel region corresponding to the first space as compared with the p-type impurity contained in the remaining region of the transfer channel region other than the region corresponding to the first space. Thus, reduction of the hole concentration can be suppressed in the region of the transfer channel region corresponding to the first space also when the n-type impurity concentration in the transfer channel region is increased. Therefore, unintentional charge resulting from thermal excitation or the like can be effectively captured by holes in the transfer channel region located under an OFF-state gate electrode, whereby increase of a dark current can be suppressed.

In the solid-state image sensor according to the aforementioned aspect, the first conductivity type transfer channel region is preferably an n-type transfer channel region, and the second conductivity type impurity is preferably a p-type impurity. According to this structure, reduction of the hole concentration can be easily suppressed in the region of the transfer channel region corresponding to the first space also when the n-type impurity concentration in the transfer channel region is increased.

In the solid-state image sensor according to the aforementioned aspect, the region of the transfer channel region corresponding to the first space is preferably formed with a potential barrier higher than a potential barrier of the remaining region of the transfer channel region other than the region corresponding to the first space. According to this structure, the high potential barrier of the region of the transfer channel region corresponding to the first space can easily suppress outflow of the charge from the potential well of the photoelectric conversion portion of the prescribed pixel into the potential well of the photoelectric conversion portion of another pixel adjacent to the prescribed pixel through the transfer channel region also when the first conductivity type impurity concentration in the transfer channel region is increased to reduce the heights of the potential barriers of the transfer channel region.

In the solid-state image sensor according to the aforementioned aspect, the gate electrode of the prescribed pixel and the gate electrode of another pixel adjacent to the prescribed pixel are arranged not to overlap with each other. According to this structure, a larger quantity of second conductivity type impurity can be easily introduced into the region of the transfer channel region corresponding to the first space as compared with the second conductivity type impurity contained in the remaining region of the transfer channel region other than the region corresponding to the first space by ion-implanting the second conductivity type impurity into the transfer channel region located on the main surface of the substrate through the first space provided between the gate electrodes of the prescribed pixel and another pixel adjacent to the prescribed pixel.

In the solid-state image sensor according to the aforementioned aspect, the concentration of the second conductivity type impurity introduced into the region of the transfer channel region corresponding to the first space is preferably at a level capable of maintaining the first conductivity type of the transfer channel region. According to this structure, the region of the transfer channel region corresponding to the first space does not invert to the second conductivity type, whereby the region of the transfer channel region corresponding to the first space can be inhibited from formation of a potential dip. Thus, it is possible to suppress inhibition of charge transfer by a potential dip formed on the region of the transfer channel region corresponding to the first space.

In this case, the concentration of the second conductivity type impurity is preferably set lower than the concentration of a first conductivity type impurity in the region of the transfer channel region corresponding to the first space. According to this structure, the region of the transfer channel region corresponding to the first space to the second conductivity type can be so easily inhibited from inverting to the second conductivity type that the region of the transfer channel region corresponding to the first space can be easily inhibited from formation of a potential dip.

In the aforementioned solid-state image sensor setting the concentration of the second conductivity type impurity in the region of the transfer channel region corresponding to the first space lower than the concentration of the first conductivity type impurity, the first conductivity type impurity concentration in the region of the transfer channel region corresponding to the first space and the first conductivity type impurity concentration in the remaining region of the transfer channel region other than the region corresponding to the first space are preferably substantially equal to each other. According to this structure, potentials resulting from the first conductivity type impurity can be substantially equalized with each other in the region of the transfer channel region corresponding to the first space and the remaining region other than that corresponding to the first space, whereby a potential barrier higher than that of the region other than the region corresponding to the first space can be easily formed on the region corresponding to the first space by introducing a larger quantity of second conductivity type impurity into the region corresponding to the first space as compared with the second conductivity type impurity contained in the remaining region other than that corresponding to the first region.

In this case, the first conductivity type impurity is preferably an n-type impurity, the second conductivity type impurity is preferably a p-type impurity, and the hole concentration of the region of the transfer channel region corresponding to the first space is preferably higher than the hole concentration of the remaining region of the transfer channel region other than the region corresponding to the first space. According to this structure, unintentional charge resulting from thermal excitation or the like can be effectively captured by holes in the region of the transfer channel region, located under an OFF-state gate electrode, corresponding to the first space, whereby increase of a dark current can be easily suppressed.

In the aforementioned solid-state image sensor setting the concentration of the second conductivity type impurity introduced into the region of the transfer channel region corresponding to the first space to the level capable of maintaining the first conductivity type of the transfer channel region, the concentration of the second conductivity type impurity introduced into the region of the transfer channel region corresponding to the first space is preferably at the maximum level capable of maintaining the first conductivity type of the transfer channel region. The expression "the maximum concentration of the second conductivity type impurity introduced into the region of the transfer channel region corresponding to the first space capable of maintaining the first conductivity type of the transfer channel region" is directed to a concept including "not only the maximum concentration of the second conductivity type impurity introduced into the region of the transfer channel region corresponding to the first space capable of maintaining the first conductivity type of the transfer channel region but also a substantially maximum concentration approximate to the aforementioned maximum concentration". When the first and second conductivity types are n- and p-types respectively, for example, the height of the potential barrier as well as the hole concentration of the region of the transfer channel region corresponding to the first space can be maximized while inhibiting the region of the n-type transfer channel region corresponding to the first space from inverting to the p-type according to the aforementioned structure. Thus, blooming can be more reliably suppressed and increase of a dark current can be further suppressed while inhibiting the region of the n-type transfer channel region corresponding to the first space from inverting to the p-type.

In the solid-state image sensor according to the aforementioned aspect, hydrogen is preferably introduced into a region of the main surface of the substrate corresponding to the first space. According to this structure, dangling bonds present in the region of the main surface of the substrate corresponding to the first space can be terminated by hydrogen introduced into this region, whereby the number of crystal defects present in the region of the main surface of the substrate corresponding to the first space can be reduced. Thus, the quantity of unintentional charge resulting from crystal defects can be reduced in the region of the main surface of the substrate corresponding to the first space. Therefore, a dark current resulting from such unintentional charge can be reduced.

In the solid-state image sensor according to the aforementioned aspect, the gate electrode preferably includes a first gate electrode and a second gate electrode arranged on a portion of the main surface of the substrate located in the same pixel at a second space to hold the photoelectric conversion portion therebetween, the potential of the photoelectric conversion portion is preferably substantially fixed to a prescribed value, and the potential of a portion of the transfer channel region located under the first gate electrode or the second gate electrode preferably goes up or down beyond the potential of the photoelectric conversion portion, thereby transferring the charge generated in the photoelectric conversion portion. According to the present invention, the expression "the potential of the photoelectric conversion portion is fixed to a prescribed value" includes such a meaning that the potential is substantially fixed with respect to increase or decrease of the potential of the portion of the transfer channel region located under the first or second gate electrode. In other words, this is a concept also including a case where the potential of the photoelectric conversion portion changes by a small quantity with respect to the quantity of increase or decrease of the potential of the portion of the transfer channel region located under the first or second gate electrode. If the first and second conductivity types are n- and p-types respectively, for example, in the solid-state image sensor having a structure so graspable that a virtual gate electrode receiving a constant voltage substantially fixing the potential of the photoelectric conversion portion is provided on the photoelectric conversion portion, the potential barrier can be formed on the region of the transfer channel region corresponding to the first space and reduction of the hole concentration can be suppressed in the region of the transfer channel region corresponding to the first space according to the aforementioned structure, also when the n-type impurity concentration in the transfer channel region is increased. Thus, blooming as well as increase of a dark current can be suppressed also when the n-type impurity concentration in the transfer channel region is increased in the solid-state image sensor having the aforementioned structure.

In this case, the first space is preferably smaller than the second space. According to this structure, the area of each pixel can be increased by reducing the first space, whereby the area of the photoelectric conversion portion provided in the pixel can be increased. Consequently, the photoreception area of the photoelectric conversion portion is so increased that the photosensitivity thereof can be improved.

The aforementioned solid-state image sensor comprising the first and second gate electrodes may apply a two-phase clock pulse signal changing to a prescribed positive electrode and a prescribed negative electrode respectively to the first gate electrode or the second gate electrode, and the potential of the portion of the transfer channel region located under the first gate electrode or the second gate electrode may go up or down beyond the potential of the photoelectric conversion portion due to the clock pulse signal.

The solid-state image sensor according to the aforementioned aspect preferably further comprises a gate insulating film formed on a region of the substrate other than the region of the transfer channel region corresponding to the first space. According to this structure, no gate insulation film is formed on the portion of the substrate corresponding to the region of the transfer channel region corresponding to the first space, whereby a larger quantity of second conductivity type impurity can be more easily introduced into the region corresponding to the first space as compared with the second conductivity type impurity contained in the remaining region other than the region corresponding to the first space by ion-implanting the second conductivity type impurity into the transfer channel region located on the main surface of the substrate through the first space.

In this case, the gate insulating film preferably includes an $SiO_2$ film and an SiN film formed on the $SiO_2$ film. According to this structure, the SiN film formed on the $SiO_2$ film can function as an antireflection film, whereby reflection of incident light can be suppressed. Thus, the photosensitivity can be improved.

In the solid-state image sensor according to the aforementioned aspect, the upper surface of the gate electrode of a prescribed pixel and the upper surface of the gate electrode of another pixel adjacent to the prescribed pixel may be planarized.

In this case, the upper surface of the gate electrode of the prescribed pixel and the upper surface of the gate electrode of another pixel adjacent to the prescribed pixel may be substantially flush with each other.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A solid-state image sensor according to an embodiment of the present invention is now described with reference to the drawings.

The structure of the solid-state image sensor according to the embodiment of the present invention is first described with reference to FIGS. 1 and 2.

Figure 1:
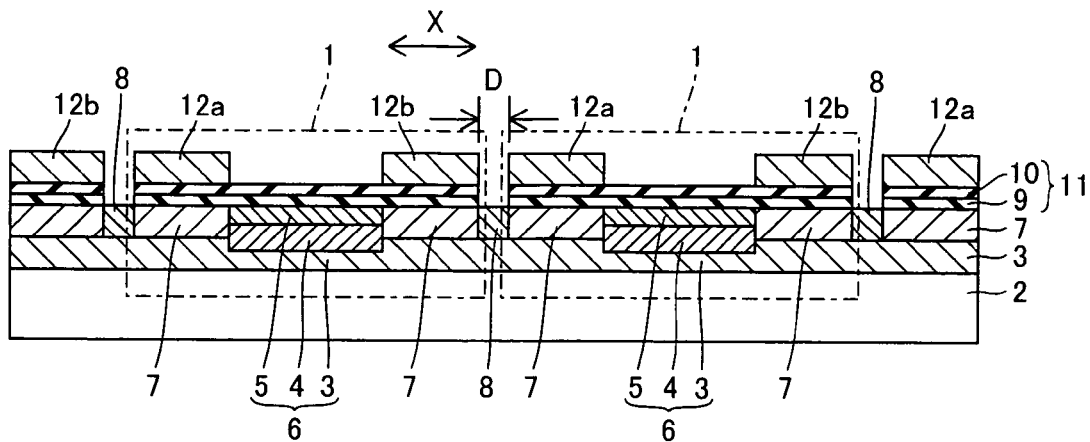
FIG. 1 is a sectional view for illustrating the structure of a solid-state image sensor according to an embodiment of the present invention.
Figure 2:
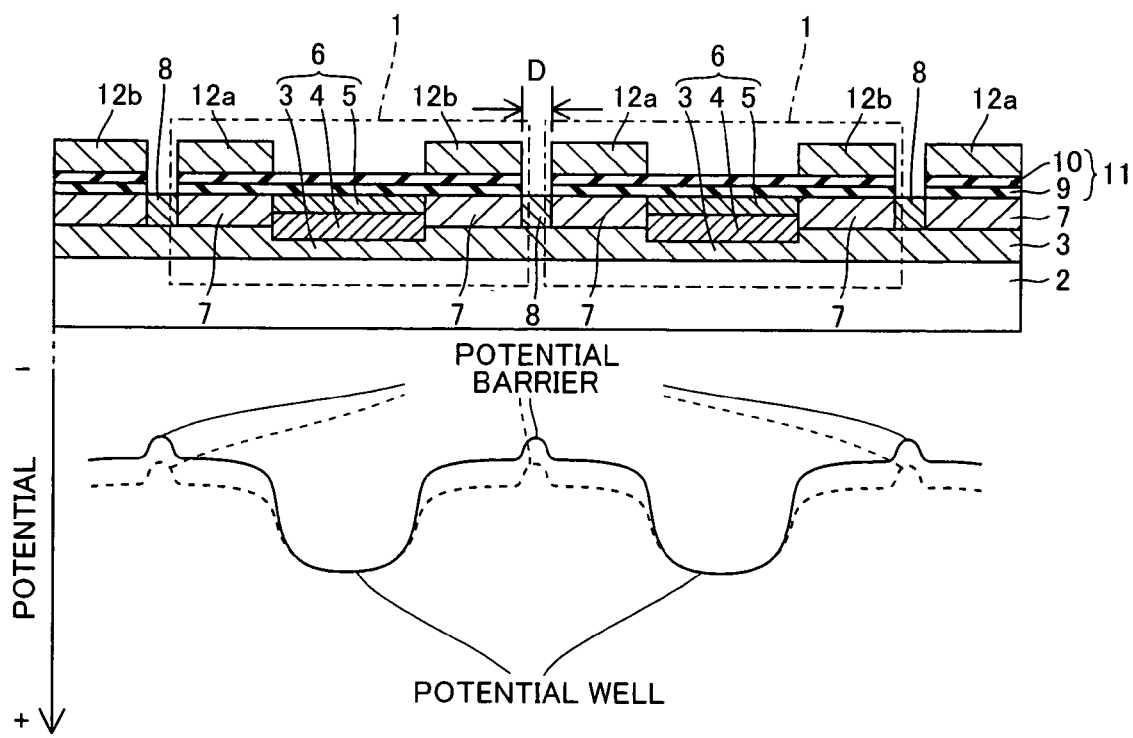
FIG. 2 is a potential diagram of the solid-state image sensor according to the embodiment of the present invention shown in FIG. 1.

In the solid-state image sensor according to this embodiment, a plurality of pixels 1 are adjacently arranged, as shown in FIG. 1. Further, the solid-state image sensor according to this embodiment comprises an n-type silicon substrate 2. This n-type silicon substrate 2 is an example of the "substrate" in the present invention. A p-type well region 3 is formed on a region of at least about 1 μm and not more than about 4 μm in depth from the upper surface of the n-type silicon substrate 2. A plurality of n-type high-concentration impurity regions 4 having an impurity concentration of about $10^{17}$ cm$^{-3}$ are formed on prescribed regions of the surface of the n-type silicon substrate 2 at prescribed intervals. The n-type high-concentration impurity regions 4 are formed on regions of at least about 0.1 μm and not more than about 1 μm in depth from the upper surface of the n-type silicon substrate 2.

P-type impurity regions 5 having an impurity concentration of about $10^{18}$ cm$^{-3}$ are formed on the surfaces of the n-type high-concentration impurity regions 4. The p-type impurity regions 5 are formed on regions of up to about 0.1 μm in depth from the upper surface of the n-type silicon substrate 2. According to this embodiment, these p-type impurity regions 5, the aforementioned n-type high-concentration impurity regions 4 and the p-type well region 3 constitute photoelectric conversion portions 6. These photoelectric conversion portions 6 are provided in one-to-one correspondence to the pixels 1 respectively. The photoelectric conversion portions 6 have potentials substantially fixed to a prescribed value. N-type transfer channel regions 7 having an impurity concentration of about $10^{16}$ cm$^{-3}$ to about $10^{17}$ cm$^{-3}$ are formed on regions of the surface of the n-type substrate 2 located between adjacent pairs of photoelectric conversion portions 6 respectively. These transfer channel regions 7 function as paths for transferring charge generated in the photoelectric conversion portions 6. The transfer channel regions 7 are formed on regions of up to about 1 μm in depth from the upper surface of the n-type silicon substrate 2.

According to this embodiment, n-type impurity regions 8 are formed on regions of the n-type transfer channel regions 7 corresponding to spaces D between gate electrodes 12a and 12b described later. Larger quantities of p-type impurities are introduced into the n-type impurity regions 8 as compared with p-type impurities contained in the remaining regions of the n-type transfer channel regions 7 other than the n-type impurity regions 8. Further, the p-type impurities introduced into the n-type impurity regions 8 are set to a substantially maximum concentration capable of maintaining the n-type of the n-type impurity regions 8. In other words, the concentration of the p-type impurities is set to a level slightly lower than that of n-type impurities in the n-type impurity regions 8. Thus, the n-type impurity regions 8 of the transfer channel regions 7, not inverting to the p-type, are inhibited from formation of potential dips. According to this embodiment, further, the n-type impurity regions 8 are formed with potential barriers having higher potentials than the remaining regions of the transfer channel regions 7 other than the n-type impurity regions 8, as shown in FIG. 2. The n-type impurity regions 8, having the p-type impurity concentration higher than that of the transfer channel regions 7, have a higher hole concentration than the transfer channel regions 7.

An SiO$_2$ film 9 having a thickness of several 10 nm is formed to cover the remaining regions of the n-type silicon substrate 2 other than the n-type impurity regions 8. An SiN film 10 having a thickness of several 10 nm is formed on the SiO$_2$ film 9. This SiN film 10 has a function for serving as an antireflection film. The SiO$_2$ film 9 and the SiN film 10 constitute a gate insulating film 11. The gate electrodes 12a (12b) of polysilicon are formed on regions of the gate insulating film 11 corresponding to the transfer channel regions 7. The gate electrodes 12a and 12b are examples of the "first gate electrode" and the "second gate electrode" in the present invention respectively. Each pair of gate electrodes 12a and 12b are provided in one-to-one correspondence to each pixel 1.

According to this embodiment, the gate electrodes 12a and 12b provided in each pixel 1 are arranged at a prescribed space to hold the corresponding photoelectric conversion portion 6 therebetween. Further, the gate electrode 12a of a prescribed pixel 1 and the gate electrode 12b of another pixel 1 adjacent to the prescribed pixel 1 are arranged at a space D (=about 0.15 μm), not to overlap with each other. The gate electrodes 12a and 12b have a thickness of several 10 nm, a width (along arrow X in FIG. 1) of several 100 nm and a length (in a direction perpendicular to the direction X in FIG. 1) of several μm. According to this embodiment, the solid-state image sensor applies a negative voltage to the gate electrodes 12a and 12b, so that the potentials of the transfer channel regions 7 located under the gate electrodes 12a and 12b are higher than the fixed potentials of the photoelectric conversion portions 6 as shown in FIG. 2. Thus, potential wells are formed in the photoelectric conversion portions 6 in imaging for storing charge resulting from photoelectric conversion, as shown in FIG. 2.

The solid-state image sensor applies two-phase clock pulse signals changing to prescribed positive and negative voltages respectively to the gate electrodes 12a and 12b. The solid-state image sensor increases or decreases the potentials of the transfer channel regions 7 located under the gate electrodes 12a and 12b with the two-phase clock pulse signals, thereby successively transferring the charge stored in the potential wells of the photoelectric conversion portions 6 to the transfer channel regions 7 and the photoelectric conversion portions 6 of the adjacent pixels 1. The potentials of the photoelectric conversion portions 6 are substantially fixed also in charge transfer. In the photoelectric conversion portions 6, the potentials of the p-type impurity regions 5 are fixed in imaging and charge transfer, while those of the n-type high-concentration impurity regions 4 and the p-type well region 3 slightly change in charge transfer with respect to those in imaging. However, the quantities of the current potential changes in the n-type high-concentration impurity regions 4 and the p-type well region 3 are small as compared with the quantities of potential increase or decrease of the transfer channel regions 7 located under the gate electrodes 12a and 12b. When the potentials of the transfer channel regions 7 adjacent to the photoelectric conversion portions 6 exceed the substantially fixed potentials of the photoelectric conversion portions 6, the potentials of the photoelectric conversion portions 6 reach the bottoms of the potential wells. When the potentials of the transfer channel regions 7 adjacent to the photoelectric conversion portions 6 fall below the substantially fixed potentials of the photoelectric conversion portions 6, on the other hand, the potentials of the photoelectric conversion portions 6 function as potential barriers between adjacent pairs of potential wells. Thus, the solid-state image sensor according to this embodiment has a structure so graspable that virtual gate electrodes receiving a constant voltage substantially fixing the potentials of the photoelectric conversion portions 6 are provided on the photoelectric conversion portions 6, although no gate electrodes are provided on the photoelectric conversion portions 6 in practice.

A process of manufacturing the solid-state image sensor according to this embodiment is now described with reference to FIGS. 1 and 3 to 7.

Figure 3:
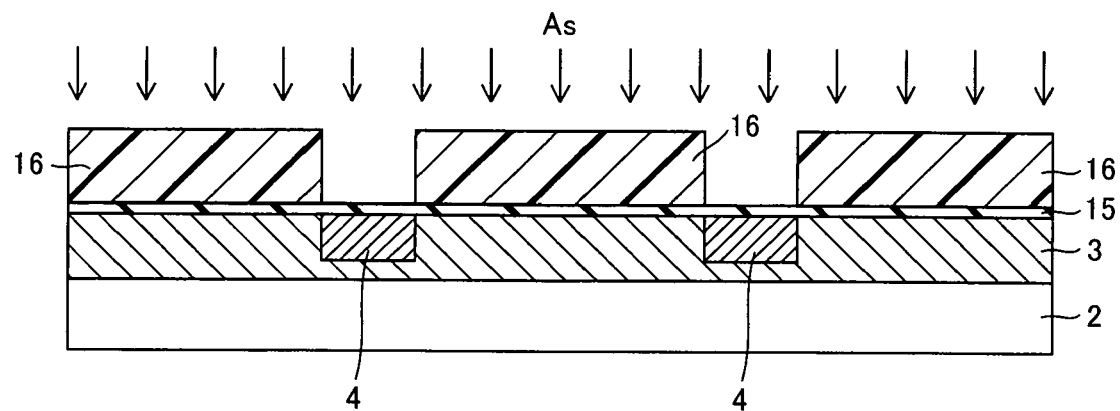
FIGS. 3 to 7 are sectional views for illustrating a process of manufacturing the solid-state image sensor according to the embodiment of the present invention.

According to the first embodiment, p-type impurities are first ion-implanted into the n-type silicon substrate 2 thereby forming the p-type well region 3 up to the depth of several 10 µm from the upper surface of the n-type silicon substrate 2, as shown in FIG. 3. Thereafter the surface of the n-type silicon substrate 2 is thermally oxidized, thereby forming an $SiO_2$ film 15 having a thickness of several 10 nm as a sacrifice oxide film on the surface of the n-type silicon substrate 2. This $SiO_2$ film 15 serving as a sacrifice oxide film is provided for protecting the n-type silicon substrate 2 against damage in a subsequent ion implantation step. Thereafter resist films 16 are formed to cover regions other than those for forming the n-type high-concentration impurity regions 4. These resist films 16 are employed as masks for ion-implanting As (arsenic) into the n-type silicon substrate 2 under conditions of implantation energy of several 100 keV and a dose of about $10^{12}$ to about $10^{13}$ cm$^{-2}$. Thus, the plurality of n-type high-concentration impurity regions 4 are formed on the prescribed regions of the surface of the n-type silicon substrate 2 at the prescribed intervals. Thereafter the resist films 16 are removed.

Figure 4:
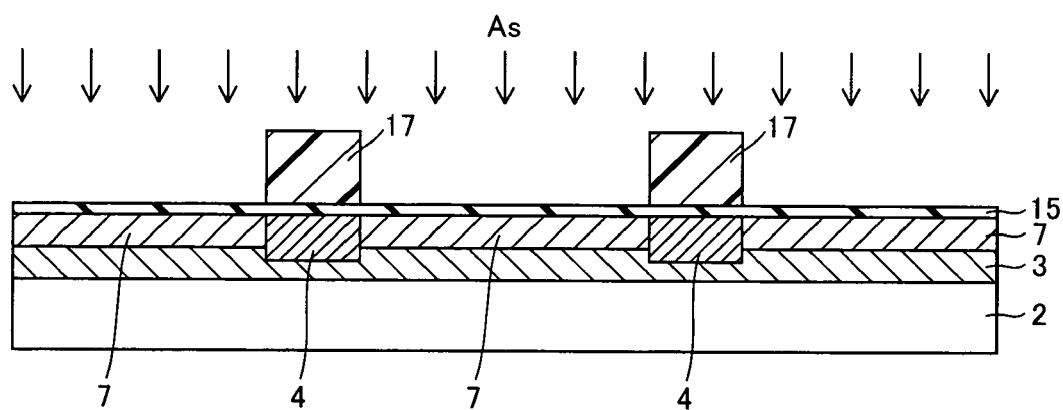

As shown in FIG. 4, resist films 17 are formed by photolithography and etching, to cover only the n-type high-impurity regions 4. These resist films 17 are employed as masks for ion-implanting As (arsenic) into the silicon substrate 2 under conditions of implantation energy of several 10 keV and a dose of about several $10^{12}$ cm$^{-2}$. Thereafter annealing is performed under conditions of about 800° C. to about 950° C. for about one hour. Thus, the n-type transfer channel regions 7 are formed on the regions between the adjacent pairs of n-type high-concentration impurity regions 4 on the surface of the n-type silicon substrate 2. Thereafter the resist films 17 are removed. The $SiO_2$ film 15 is also removed.

Figure 5:
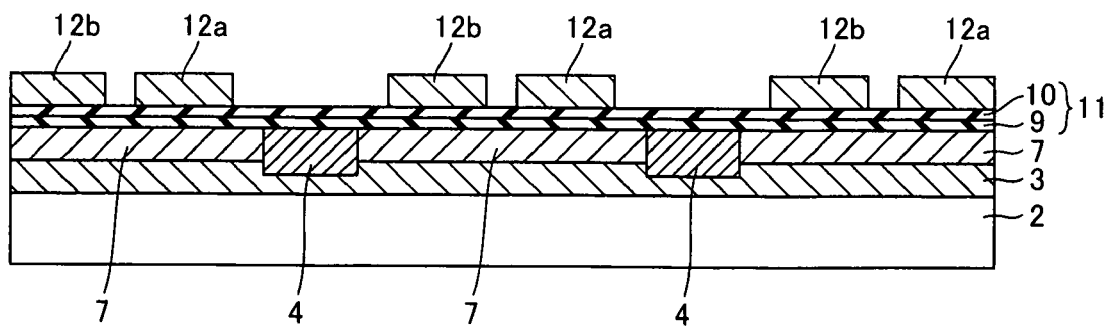

As shown in FIG. 5, the $SiO_2$ film 9 having the thickness of several 10 nm is formed by thermally oxidizing the surface of the n-type silicon substrate 2. Thereafter the SiN film 10 having the thickness of several 10 nm is formed on the $SiO_2$ film 9 by CVD (chemical vapor deposition). This SiN film 10 and the $SiO_2$ film 9 constitute the gate insulating film 11. Thereafter the plurality of gate electrodes 12a and 12b of polysilicon are formed on the prescribed regions of the SiN film 10 at prescribed intervals by photolithography and etching. At this time, the gate electrodes 12a and 12b provided on a region between a prescribed n-type high-concentration impurity region 4 and another n-type high-concentration impurity region 4 adjacent to the prescribed n-type high-concentration impurity region 4 are arranged at the space D of about 0.15 µm.

Figure 6:
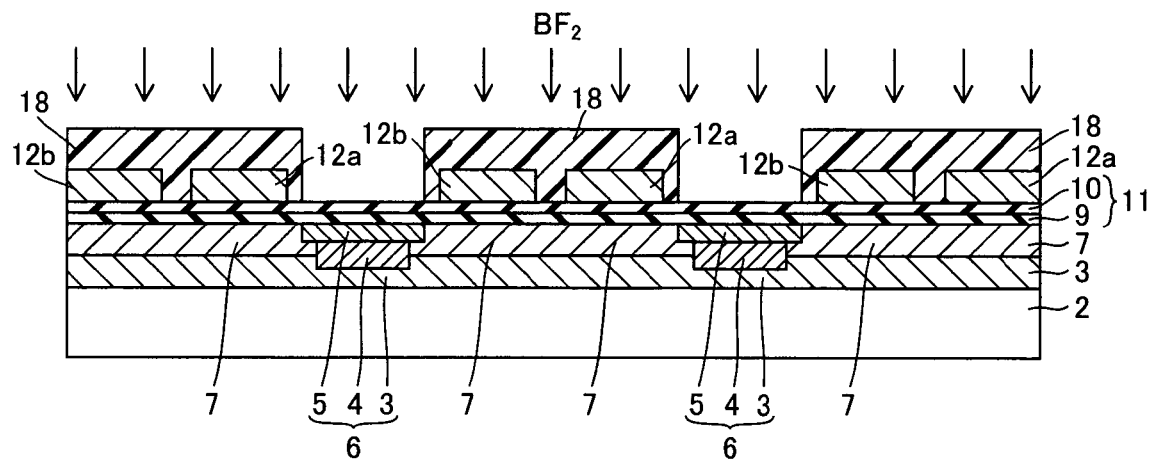

As shown in FIG. 6, resist films 18 are formed to cover regions other than those for forming the p-type impurity regions 5. These resist films 18 are employed as masks for ion-implanting $BF_2$ into the n-type silicon substrate 2 under conditions of implantation energy of several 10 keV and a dose of about $10^{13}$ cm$^{-2}$, thereby forming the p-type impurity regions 5. Thereafter the resist films 18 are removed.

Figure 7:
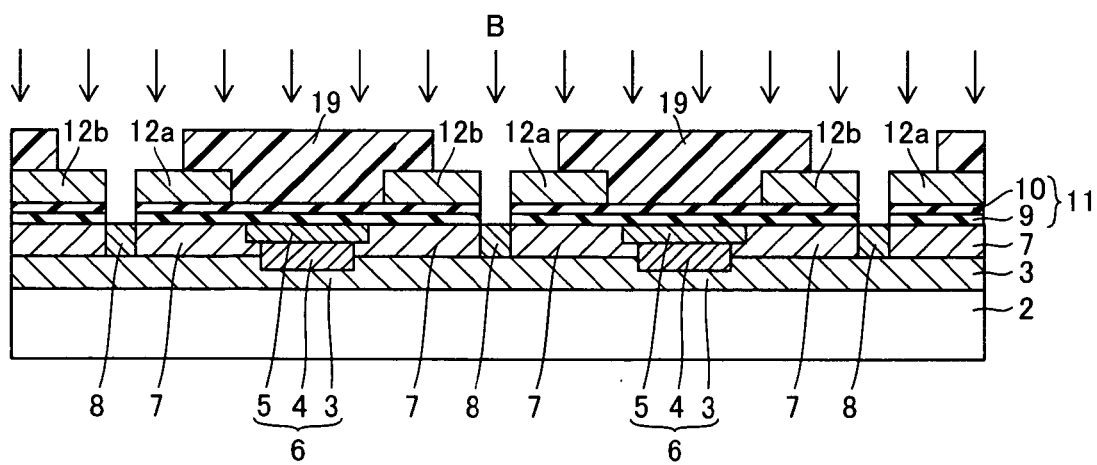

According to this embodiment, resist films 19 are formed to cover regions other than those for forming the n-type impurity regions 8, and parts of the SiN film 10 and the $SiO_2$ film 9 located between the gate electrodes 12a and 12b are removed by etching, as shown in FIG. 7. The resist films 19 and the gate electrodes 12a and 12b are employed as masks for ion-implanting B (boron) into the n-type silicon substrate 2 under conditions of implantation energy of several keV and a dose of several $10^{12}$ cm$^{-2}$. Thus, the n-type impurity regions 8, into which larger quantities of p-type impurities are introduced as compared with those in the remaining regions of the transfer channel regions 7, are formed on the regions of the transfer channel regions 7 corresponding to the spaces D between the gate electrodes 12a and 12b of the adjacent pairs of pixels 1.

Finally, annealing is performed under conditions of about 800° C. to about 950° C. for about one hour, thereby electrically activating the impurities introduced into the n-type silicon substrate 2. The solid-state image sensor according to this embodiment shown in FIG. 1 is formed in the aforementioned manner.

According to this embodiment, wires (not shown) are thereafter connected to the gate electrodes 12a and 12b while a protective film (not shown) is formed to cover the overall upper surface, and annealing is thereafter performed in a hydrogen atmosphere of several 100° C., thereby introducing hydrogen into the n-type impurity regions 8 through the regions between the gate electrodes 12a and 12b of the adjacent pairs of pixels 1. Thus, hydrogen terminates dangling bonds of silicon in the n-type impurity regions 8.

According to this embodiment, as hereinabove described, the gate electrodes 12a of prescribed pixels 1 and the gate electrodes 12b of pixels 1 adjacent to the prescribed pixels 1 are provided at the spaces D respectively while larger quantities of p-type impurities are introduced into the n-type impurity regions 8 of the n-type transfer channel regions 7, located on the surface of the n-type silicon substrate 2, corresponding to the spaces D as compared with the p-type impurities contained in the remaining regions of the n-type transfer channel regions 7 other than the n-type impurity regions 8, whereby potential barriers higher than those of the remaining regions of the transfer channel regions 7 other than the n-type impurity regions 8 can be formed in the n-type impurity regions 8. Thus, the potential barriers of the n-type impurity regions 8 can suppress outflow of the charge from the potential wells of the photoelectric conversion portions 6 of the prescribed pixels 1 into the potential wells of the photoelectric conversion portions 6 of the pixels 1 adjacent to the prescribed pixels 1 through the transfer channel regions 7 also when the n-type impurity concentrations in the transfer channel regions 7 are increased for increasing the quantities of charge transfer to result in reduction of the potentials of the transfer channel regions 7 as shown by broken lines in FIG. 2, for example. Thus, blooming, a phenomenon brightly displaying unirradiated portions, resulting from such outflow of the charge can be suppressed.

According to this embodiment, further, larger quantities of p-type impurities are introduced into the n-type impurity regions 8 of the n-type transfer channel regions 7 as compared with the p-type impurities contained in the remaining regions of the n-type transfer channel regions 7 other than the n-type impurity regions 8, whereby the hole concentrations can be increased in the n-type impurity regions 8 of the transfer channel regions 7. Thus, reduction of the hole concentrations in the n-type impurity regions 8 can be suppressed also when the n-type impurity concentrations in the transfer channel regions 7 are increased in order to increase the quantities of charge transfer. Therefore, unintentional charge can be effectively captured by holes in the transfer channel regions 7 located under OFF-state gate electrodes 12a and 12b, whereby increase of a dark current can be suppressed.

According to this embodiment, the gate electrodes 12a of the prescribed pixels 1 and the gate electrodes 12b of the pixels 1 adjacent to the prescribed pixels 1 are arranged not to overlap with each other, whereby the p-type impurities can be easily ion-implanted into the transfer channel regions 7 located on the surface of the n-type silicon substrate 2 through the spaces D provided between the gate electrodes 12a of the prescribed pixels 1 and the gate electrodes 12b of the pixels 1 adjacent to the prescribed pixels 1. Thus, larger quantities of p-type impurities can be easily introduced into the n-type impurity regions 8 of the transfer channel regions 7 as compared with the p-type impurities contained in the remaining regions of the n-type transfer channel regions 7 other than the n-type impurity regions 8.

According to this embodiment, the p-type impurities introduced into the n-type impurity regions 8 are set to the concentration capable of maintaining the n-type of the transfer channel regions 7 so that the n-type impurity regions 8 of the transfer channel regions 7 do not invert to the p-type, whereby the n-type impurity regions 8 of the transfer channel regions 7 can be inhibited from formation of potential dips. Thus, it is possible to suppress inhibition of charge transfer by potential dips formed on the n-type impurity regions 8 of the transfer channel regions 7.

According to this embodiment, the p-type impurities introduced into the n-type impurity regions 8 are set to the substantially maximum concentration capable of maintaining the n-type of the transfer channel regions 7, whereby the height of the potential barriers as well as the hole concentration of the n-type impurity regions 8 can be maximized while inhibiting the n-type impurity regions 8 from inverting to the p-type. Thus, blooming can be more reliably suppressed and increase of a dark current can be further suppressed while inhibiting the p-type impurity regions 8 from inverting to the p-type.

According to this embodiment, hydrogen is so introduced into the n-type impurity regions 8 on the surface of the n-type silicon substrate 2 that dangling bonds present in the n-type impurity regions 8 can be terminated by the introduced hydrogen. Thus, the number of crystal defects present in the n-type impurity regions 8 can be reduced. Therefore, the quantity of unintentional charge resulting from crystal defects can be reduced in the n-type impurity regions 8. Thus, a dark current resulting from such unintentional charge can be reduced.

Figure 8:
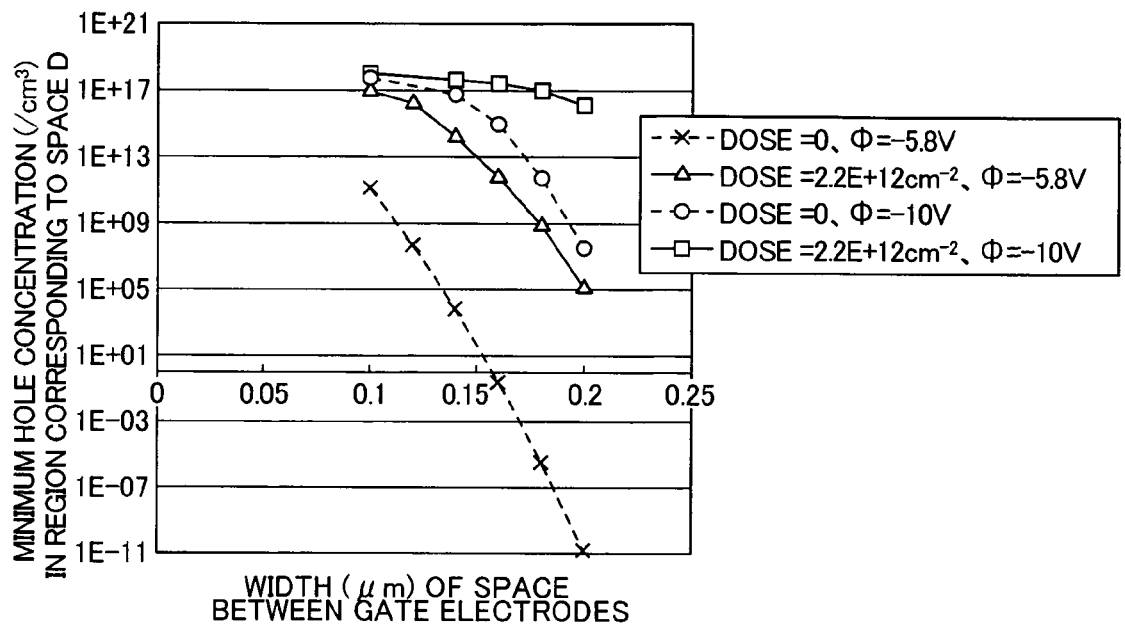
FIG. 8 is a correlation diagram showing the relation between the width of a space D between gate electrodes and the minimum hole concentration of a region of a transfer channel region corresponding to the space D in the solid-state image sensor according to the embodiment of the present invention.

Simulations performed for confirming the effects of the aforementioned embodiment are now described. First, a simulation of obtaining changes of the minimum hole concentration of the region (n-type impurity region 8) of the transfer channel region 7 corresponding to the space D in a case of varying the space D (see FIG. 1) (=width of the n-type impurity region 8) between the gate electrode 12a of a prescribed pixel 1 and the gate electrode 12b of another pixel 1 adjacent to the prescribed pixel 1 was performed in relation to the structure of the solid-state image sensor according to the aforementioned embodiment. At this time, the dose of B (boron) ion-implanted into the region of the transfer channel region 7 corresponding to the space D was set to zero or $2.2 \times 10^{12}$ cm$^{-2}$ while a voltage $\Phi$ applied to the gate electrodes 12a and 12b was set to $-5.8$ V or $-10$ V, for performing the simulation. FIG. 8 shows the results of this simulation.

Referring to FIG. 8, it is understood that the minimum hole concentration of the region (n-type impurity region 8) corresponding to the space D between the gate electrodes 12a and 12b is increased when the dose of B (boron) is $2.2 \times 10^{12}$ cm$^{-2}$, as compared with the case where the dose of B (boron) is zero. Therefore, it has been recognized possible to increase the hole concentration of the region of the transfer channel region 7 corresponding to the space D between the gate electrodes 12a and 12b by ion-implanting B (boron) into the transfer channel region 7 thereby forming the n-type impurity region 8. Thus, unintentional charge can be captured by holes, thereby suppressing increase of a dark current.

It is also understood from FIG. 8 that the minimum hole concentration of the region of the transfer channel region 7 corresponding to the space D is gradually reduced as the width of the space D between the gate electrodes 12a and 12b is increased. This is conceivably for the following reason: As the width of the space D between the gate electrodes 12a and 12b is increased, influence exerted by an electric field resulting from the gate electrodes 12a and 12b receiving the negative voltage is gradually reduced around the center of the region of the transfer channel region 7 corresponding to the space D. Thus, the number of holes induced by the electric field from the gate electrodes 12a and 12b around the center of the region of the transfer channel region 7 corresponding to the space D is reduced, whereby the minimum hole concentration of the region of the transfer channel region 7 corresponding to the space D is conceivably gradually reduced as the width of the space D between the gate electrodes 12a and 12b is increased.

It is further understood from FIG. 8 that the minimum hole concentration of the region of the transfer channel region 7 corresponding to the space D is increased when the voltage $\Phi$ applied to the gate electrodes 12a and 12b is $-10$ V, as compared with the case of −5.8 V. This is conceivably because a larger number of holes are induced to the region of the transfer channel region 7 corresponding to the space D between the gate electrodes 12a and 12b as the negative voltage applied to the gate electrodes 12a and 12b is increased.

Figure 9:
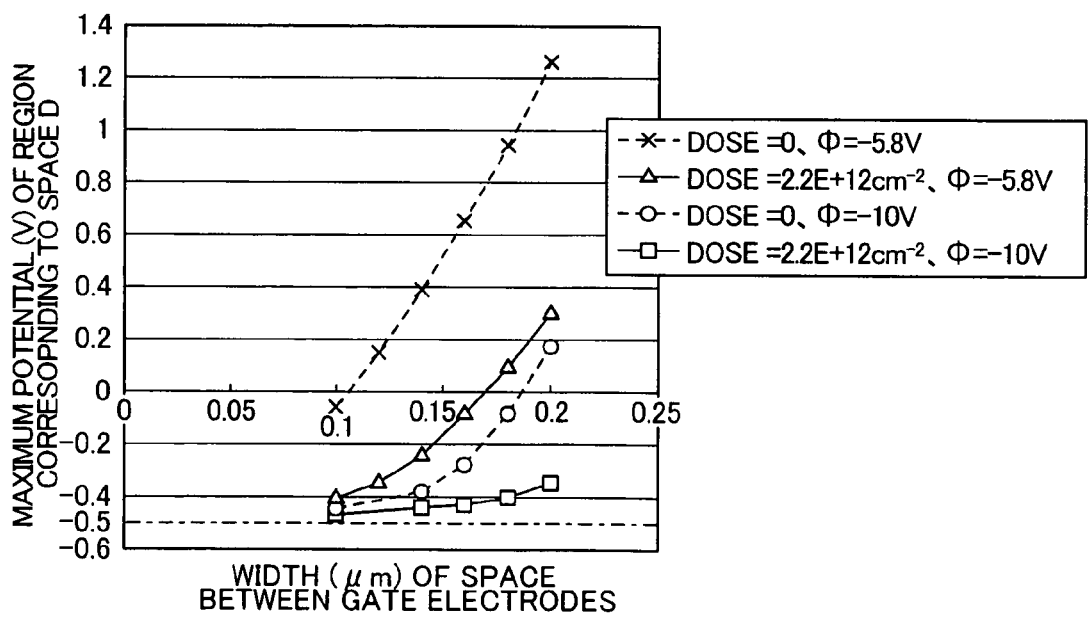
FIG. 9 is a correlation diagram showing the relation between the width of the space D between the gate electrodes and the maximum potential of the region of the transfer channel region corresponding to the space D in the solid-state image sensor according to the embodiment of the present invention.
Figure 10:
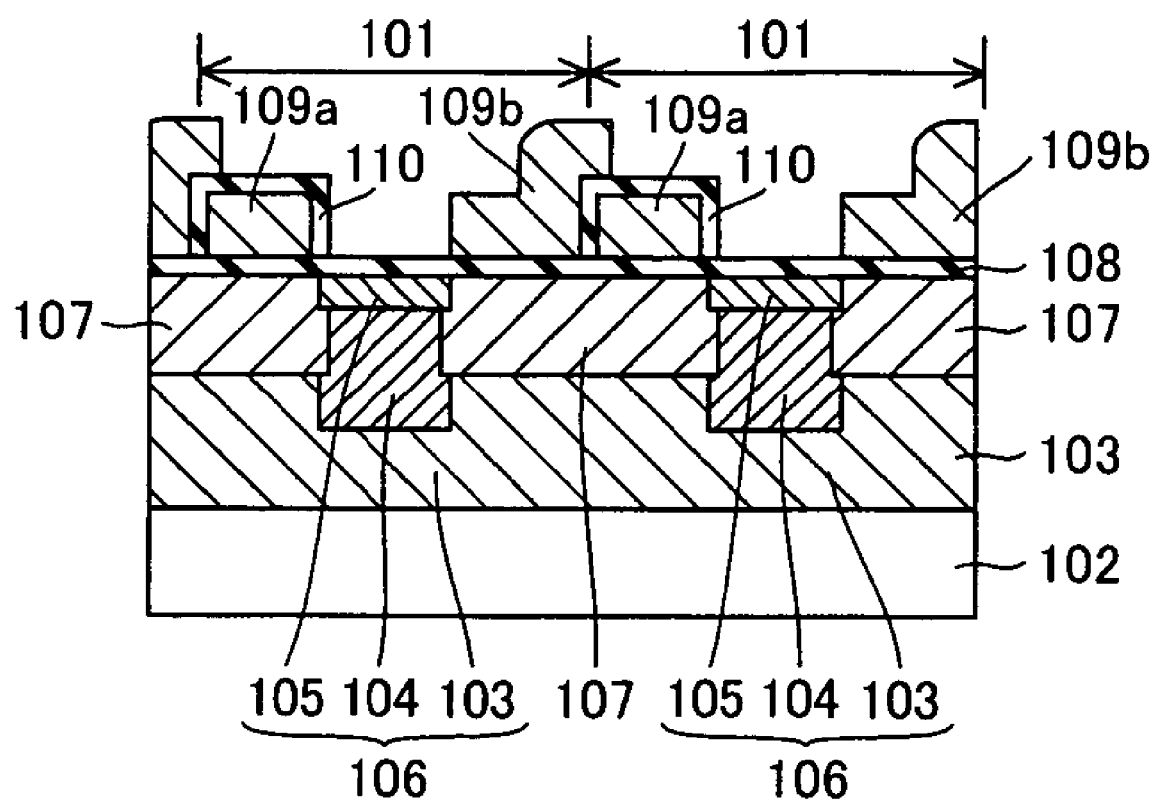
FIG. 10 is a sectional view for illustrating the structure of an exemplary conventional solid-state image sensor.

Then, another simulation was performed for obtaining changes of the maximum potential of the region (n-type impurity region 8) of the transfer channel region 7 corresponding to the space D in the case of varying the space D (=width of the n-type impurity region 8) between the gate electrode 12a of the prescribed pixel 1 and the gate electrode 12b of another pixel 1 adjacent to the prescribed pixel 1. At this time, the dose of B (boron) ion-implanted into the region of the transfer channel region 7 corresponding to the space D was set to zero or $2.2 \times 10^{12}$ cm$^{-2}$ while the voltage Φ applied to the gate electrodes 12a and 12b was set to −5.8 V or −10 V, for performing the simulation. FIG. 9 shows the results of this simulation. The maximum potential shown in FIG. 9 is that of the surface of the transfer channel region 7 located on the center between the gate electrodes 12a and 12b. It is assumed that the potential is pinned to a level around −0.5 V in the transfer channel region 7 located under the gate electrodes 12a and 12b receiving the prescribed negative voltage.

Referring to FIG. 9, it is understood that the maximum potential of the region of the transfer channel region 7 corresponding to the space D is gradually increased beyond −0.5 V as the width of the space D between the gate electrodes 12a and 12b is increased. This is conceivably for the following reason: As the width of the space D between the gate electrodes 12a and 12b is increased, influence exerted by the electric field from the gate electrodes 12a and 12b receiving the negative voltage is gradually reduced around the center of the region of the transfer channel region 7 corresponding to the space D. Thus, the potential around the center of the region of the transfer channel region 7 corresponding to the space D is gradually increased from the level (around −0.5 V) to which the same is pinned when the transfer channel region 7 is located under the gate electrodes 12a and 12b receiving the negative voltage. Thus, the maximum potential of the region of the transfer channel region 7 corresponding to the space D is conceivably gradually increased beyond −0.5 V as the width of the space D between the gate electrodes 12a and 12b is increased.

It is further understood from FIG. 9 that the maximum potential of the region of the transfer channel region 7 corresponding to the space D is more gently increased beyond −0.5 V as the width of the space D between the gate electrodes 12a and 12b is increased when the voltage Φ applied to the gate electrodes 12a and 12b is −10 V, as compared with the case of −5.8 V. This is because the gate electrodes 12a an 12b apply a stronger electric field to the region of the transfer channel region 7 corresponding to the space D between the gate electrodes 12a and 12b as the negative voltage applied thereto is increased. Thus, increase of the potential of the region of the transfer channel region 7 corresponding to the space D is conceivably suppressed as the negative voltage applied to the gate electrodes 12a and 12b is increased, also when the width of the space D between the gate electrodes 12a and 12b is increased.

It is further understood from FIG. 9 that the maximum potential of the region of the transfer channel region 7 corresponding to the space D is more gently increased beyond −0.5 V as the width of the space D between the gate electrodes 12a and 12b is increased when the dose of B (boron) is $2.2 \times 10^{12}$ cm$^{-2}$, as compared with the case of zero.

Particularly when the dose of B (boron) is $2.2 \times 10^{12}$ cm$^{-2}$ and the voltage Φ applied to the gate electrodes 12a and 12b is −10 V, increase of the potential beyond −0.5 V is suppressed. It has been recognized from these results that the maximum value of the potential barrier (see FIG. 2) of the region of the transfer channel region 7 corresponding to the space D can be easily held in the state pinned to the level around −0.5 V as the negative voltage applied to the gate electrodes 12a and 12b as well as the dose of B (boron) ion-implanted into the transfer channel region 7 are increased, also when the width of the space D between the gate electrodes 12a an 12b is increased.

Therefore, the maximum value of the potential barrier of the region of the transfer channel region 7 corresponding to the space D can be more inhibited from changing from −0.5 V toward a positive level as the negative voltage applied to the gate electrodes 12a and 12b as well as the dose of B (boron) ion-implanted into the transfer channel region 7 are increased, whereby the height of the potential barrier formed on this region can be further inhibited from reduction. Thus, the potential barrier formed on the region of the transfer channel region 7 corresponding to the space D between the gate electrodes 12a and 12b can more reliably suppress outflow of the charge from a prescribed potential well into an adjacent potential well when the negative voltage applied to the gate electrodes 12a and 12b as well as the dose of B (boron) ion-implanted into the transfer channel region 7 are increased. Therefore, blooming, a phenomenon brightly displaying unirradiated portions, resulting from such outflow of the charge can be more reliably suppressed.

Although the present invention has been described and illustrated in detail, it is clearly understood that the same is by way of illustration and example only and is not to be taken by way of limitation, the spirit and scope of the present invention being limited only by the terms of the appended claims.

For example, while the aforementioned embodiment is applied to the solid-state image sensor having the structure provided with the gate electrodes not formed on photoelectric conversion portions but formed to hold the photoelectric conversion portions therebetween, the present invention is not restricted to this but is also applicable to a solid-state image sensor having a structure other than the aforementioned one.

Further, the conductivity types (p- and n-types) of the respective layers may alternatively be switched in the solid-state image sensor according to the aforementioned embodiment. In this case, p-type impurity regions 8 are formed on regions of p-type transfer channel regions 7 corresponding to the spaces D between the gate electrodes 12a and 12b. Further, larger quantities of n-type impurities are introduced into the p-type impurity regions 8 as compared with n-type impurities contained in the remaining regions of the transfer channel regions 7 other than the impurity regions 8. In this case, the n-type impurities introduced into the impurity regions 8 are preferably set to a substantially maximum concentration capable of keeping the p-type of the impurity regions 8.

What is claimed is:

1. A solid-state image sensor with a plurality of pixels, wherein the solid-state sensor comprises:
    a left pixel comprising: a left pixel photoelectric conversion portion provided on a prescribed region of the main surface of a substrate, a left pixel first gate electrode, a left pixel second gate electrode;
    a right pixel comprising: a right pixel photoelectric conversion portion provided on a prescribed region of the main surface of the substrate, a right pixel first gate electrode, and a right pixel second gate electrode;

wherein a small gap is provided between the left pixel second gate electrode and the right pixel first gate electrode;

a first conductivity type transfer channel region is formed over the main surface of the substrate, and located between the photoelectric conversion portion of the left pixel and the photoelectric conversion portion of the right pixel;

wherein the first conductivity type transfer channel region has a first quantity of a second conductivity type impurity in a non-gap space, wherein the non-gap space includes a portion of the first conductivity type transfer channel region located under the left pixel second gate electrode and includes a portion of the first conductivity type transfer channel region located under the right pixel first gate electrode;

wherein the first conductivity type transfer channel region has a second quantity of a second conductivity type impurity in a gap space, where in the gap space includes a portion of the first conductivity type transfer channel region located under the small gap provided between the left pixel second gate electrode and the right pixel first gate electrode; and wherein the second quantity is larger than the first quantity.

2. The solid-state image sensor according to claim 1, wherein
said first conductivity type transfer channel region is an n-type transfer channel region, and
said second conductivity type impurity is a p-type impurity.

3. The solid-state image sensor according to claim 1, wherein
the gap space is formed with a potential barrier higher than a potential barrier of the non-gap space.

4. The solid-state image sensor according to claim 1, wherein
the gate electrodes of the left pixel and the gate electrodes of the right pixel, adjacent to the left pixel, are arranged not to overlap with each other.

5. The solid-state image sensor according to claim 1, wherein
the first quantity of second conductivity type impurity is at a level capable of maintaining the first conductivity type transfer channel region.

6. The solid-state image sensor according to claim 5, wherein
the first quantity of second conductivity type impurity is set lower than the quantity of a first conductivity type impurity in the gap space.

7. The solid-state image sensor according to claim 6, wherein
the quantity of the first conductivity type impurity and the quantity of the first conductivity type impurity in the non-gap space are substantial equal to each other.

8. The solid-state image sensor according to claim 7, wherein
the first conductivity type impurity is an n-type impurity, the second conductivity type impurity is a p-type impurity, and
the hole concentration of the gap space is higher than the hole concentration of the non-nap space.

9. The solid-state image sensor according to claim 5, wherein
the first quantity of second conductivity type impurity is at the maximum level capable of maintaining the first conductivity type of said transfer channel region.

10. The solid-state image sensor according to claim 1, wherein
hydrogen is introduced into the gap space.

11. The solid-state image sensor according to claim 1, wherein
the left pixel first gate electrode and left pixel second gate electrode are arranged to hold the left pixel photoelectric conversion portion therebetween,
the potential of said photoelectric conversion portion is substantially fixed to a prescribed value, and
the potential of a portion of the first conductivity type transfer channel region located under said first gate electrode or said second gate electrode goes up or down beyond the potential of said photoelectric conversion portion, thereby transferring said charge generated in said photoelectric conversion portion.

12. The solid-state image sensor according to claim 11, wherein
the gap space is smaller than the non-gap space.

13. The solid-state image sensor according to claim 11, applying a two-phase clock pulse signal changing to a prescribed positive voltage and a prescribed negative voltage respectively to said first gate electrode or said second gate electrode, wherein
the potential of said portion of the first conductivity type transfer channel region located under said first gate electrode or said second gate electrode goes up or down beyond the potential of said photoelectric conversion portion due to said clock pulse signal.

14. The solid-state image sensor according to claim 1, further comprising a gate insulating film formed on the non-gap space.

15. The solid-state image sensor according to claim 14, wherein
said gate insulating film includes an $SiO_2$ film and an SiN film formed on said $SiO_2$ film.

16. The solid-state image sensor according to claim 1, wherein
the upper surfaces of the gate electrodes are planarized.

17. The solid-state image sensor according to claim 16, wherein
the upper surfaces of the gate electrodes are substantially flush with each other.

* * * * *